(12) United States Patent
Tsai et al.

(10) Patent No.: US 10,036,964 B2
(45) Date of Patent: Jul. 31, 2018

(54) PREDICTION BASED CHUCKING AND LITHOGRAPHY CONTROL OPTIMIZATION

(71) Applicant: KLA-Tencor Corporation, Milpitas, CA (US)

(72) Inventors: Bin-Ming Benjamin Tsai, Saratoga, CA (US); Oreste Donzella, San Ramon, CA (US); Pradeep Vukkadala, Fremont, CA (US); Jaydeep Sinha, Livermore, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 249 days.

(21) Appl. No.: 14/656,422

(22) Filed: Mar. 12, 2015

(65) Prior Publication Data

US 2016/0239600 A1 Aug. 18, 2016

Related U.S. Application Data

(60) Provisional application No. 62/116,551, filed on Feb. 15, 2015.

(51) Int. Cl.
  *G06F 17/50* (2006.01)
  *G03F 7/20* (2006.01)

(52) U.S. Cl.
  CPC .......... *G03F 7/707* (2013.01); *G03F 7/70783* (2013.01)

(58) Field of Classification Search
  CPC .............................. G03F 7/707; G03F 7/70783
  USPC ....................................................... 716/136
  See application file for complete search history.

(56) References Cited

U.S. PATENT DOCUMENTS

| | | |
|---|---|---|
| 6,446,948 B1 | 9/2002 | Allen |
| 2011/0172982 A1* | 7/2011 | Veeraraghavan .. G01N 21/9501 703/13 |

FOREIGN PATENT DOCUMENTS

| | | |
|---|---|---|
| JP | 08-055778 A | 2/1996 |
| WO | 2008112673 A2 | 9/2008 |

OTHER PUBLICATIONS

Timothy A. Brunner et al., Characterization of wafer geometry and overlay error on silicon wafers with nonuniform stress, Journal of Micro/Nanolithography, MEMS, and MOEMS, Oct.-Dec. 2013, vol. 12, Issue 4, pp. 043002-1-043002-12.
PCT Search Report for International Application No. PCT/US2016/017395, dated May 25, 2016, 3 pages.
U.S. Appl. No. 14/220,665, filed Mar. 20, 2014, Chang et al.
U.S. Appl. No. 14/457,706, filed Aug. 12, 2014, Vukkadala et al.

(Continued)

*Primary Examiner* — Jack Chiang
*Assistant Examiner* — Brandon Bowers
(74) *Attorney, Agent, or Firm* — Suiter Swantz pc llo

(57) ABSTRACT

Prediction based systems and methods for optimizing wafer chucking and lithography control are disclosed. Distortions predicted to occur when a wafer is chucked by a chucking device are calculated and are utilized to control chucking parameters of the chucking device. Chucking parameters may include chucking pressures and chucking sequences. In addition, predicted distortions may also be utilized to facilitate application of anticipatory corrections. Controlling chucking parameters and/or applying anticipatory corrections help reducing or minimizing overlay errors.

32 Claims, 8 Drawing Sheets

(56) References Cited

OTHER PUBLICATIONS

Jie Gong et al., Determining local residual stresses fro high resolution wafer geometry measurements, J. Vac. Sci. Technol. B—Microelectronics and Nanometer Structures, 31(5), Sep./Oct. 2013, © 2013 American Vacuum Society, 8 pages.

Kevin T. Turner et al., Predicting distortions and overlay errors due to wafer deformation during chucking on lithography scanners, J. Micro/Nanolith. MEMS MOEMS vol. 8(4), 043015 (Oct.-Dec. 2009), © 2009 SPIE, 8 pages.

Pradeep Vukkadala, Correction strategies to compensate for image placement errors induced during EUVL mask chucking, ProQuest Dissertations and Theses, Jun. 11, 2010, © 2010 ProQuest LLC, 202 pages.

T. Brunner et al., Characterization and mitigation of overlay error on silicon wafers with nonuniform street, Optical Microlithography XXVII, Proc. of SPIE vol. 9052, 90520U © 2014 SPIE, 12 pages.

K.T. Turner et al., Monitoring Process-Induced Overlay Errors through High-Resolution Wafer Geometry Measurements, Metrology, Inspection, and Process Control for Microlithography XXVIII, Proc. of SPIE vol. 9050, 905013, © 2014 SPIE, 9 pages.

Kevin T. Turner et al., Relationship between localized wafer shape changes induced by residual stress and overlay errors, Journal of Micro/Nanolithogrpahy, MEMS, and MOEMS, Jan.-Mar. 2012/vol. 11(1), © 2012 SPIE, 9 pages.

\* cited by examiner

PREDICTION BASED CHUCKING AND LITHOGRAPHY CONTROL OPTIMIZATION

TECHNICAL FIELD

The disclosure generally relates to the field of semiconductor fabrication, and particularly to prediction based systems and methods for optimizing wafer chucking and lithography control.

BACKGROUND

Thin polished plates such as silicon wafers and the like are a very important part of modern technology. A wafer, for instance, may refer to a thin slice of semiconductor material used in the fabrication of integrated circuits and other devices. Other examples of thin polished plates may include magnetic disc substrates, gauge blocks and the like. While the technique described here refers mainly to wafers, it is to be understood that the technique also is applicable to other types of polished plates as well. The term wafer and the term thin polished plate may be used interchangeably in the present disclosure.

Fabricating semiconductor devices typically includes processing a substrate such as a semiconductor wafer using a number of semiconductor fabrication processes. For example, lithography is a semiconductor fabrication process that involves transferring a pattern from a reticle to a resist arranged on a semiconductor wafer. Additional examples of semiconductor fabrication processes include, but are not limited to, chemical-mechanical polishing, etching, deposition, and ion implantation.

Generally, certain requirements are established for the flatness and thickness uniformity of the wafers. However, the various process steps performed during fabrication may alter stresses in the thin films deposited on the wafers and result in elastic deformation that can cause significant distortions, including in-plane distortions (IPD) and/or out-plane distortions (OPD). Such distortions may lead to errors in downstream processes. For example, distortions may lead to overlay errors in lithographic patterning or the like.

Various control techniques have been developed for handling distortions that may occur during semiconductor fabrication. For example, a chucking device (e.g., a vacuum chuck or an electrostatic chuck) is typically used in a lithography tool to chuck a wafer prior to transferring patterns to the wafer. Chucking the wafer in this manner helps keeping the wafer stationary and also helps reducing out-plane distortions (OPD) of the wafer. Chucking may serve to remove some process-induced in-plane distortions (IPD) as well.

It is noted, however, that forcing a wafer onto a chuck may also cause certain types of distortions. For example, a gap may exist between a wafer and a chuck, resulting in an incomplete chucking of the wafer of which the IPD cannot be correctly estimated unless the flatness information of the chuck is also taken into consideration. In another example, while it is commonly assumed that frictions between a wafer and a chuck have negligible impact on the IPD, cases exist where such frictions do in fact affect the IPD significantly.

Therein lies a need for systems and methods to address distortions induced by chucking, to take into consideration the effects of wafer-chuck interactions, and to control a chucking device in order to optimize its impact.

SUMMARY

An embodiment of the present disclosure is directed to a method. The method may include: obtaining wafer geometry measurements of a wafer prior to the wafer being chucked by a chucking device; calculating distortions of the wafer predicted to occur when the wafer is chucked by the chucking device, wherein the predicted distortions of the wafer are calculated at least partially based on the wafer geometry measurements and a mechanics model of the chucking device; and determining whether to adjust a chucking parameter of the chucking device at least partially based on the predicted distortions of the wafer.

A further embodiment of the present disclosure is directed to a method. The method may include: obtaining wafer geometry measurements of a wafer prior to the wafer being chucked by a chucking device; calculating distortions of the wafer predicted to occur when the wafer is chucked by the chucking device, wherein the predicted distortions of the wafer are calculated at least partially based on the wafer geometry measurements and a mechanics model of the chucking device; and feed-forwarding the predicted distortions of the wafer to a lithography tool to facilitate application of anticipatory corrections at least partially based on the predicted distortions of the wafer.

An additional embodiment of the present disclosure is directed to a system. The system may include a geometry measurement tool configured to obtain wafer geometry measurements of a wafer prior to the wafer being chucked by a chucking device. The system may also include a prediction unit. The prediction unit may be configured to: calculate distortions of the wafer predicted to occur when the wafer is chucked by the chucking device, wherein the predicted distortions of the wafer are calculated at least partially based on the wafer geometry measurements and a mechanics model of the chucking device; and determine whether to adjust a chucking parameter of the chucking device at least partially based on the predicted distortions of the wafer.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Embodiments in accordance with the present disclosure are directed to systems and methods for controlling wafer chucking processes in order to reduce chucking induced wafer distortions. An overview of a system and a method in accordance with the present disclosure is presented first followed by more detailed descriptions of the components of the system.

Figure 1:
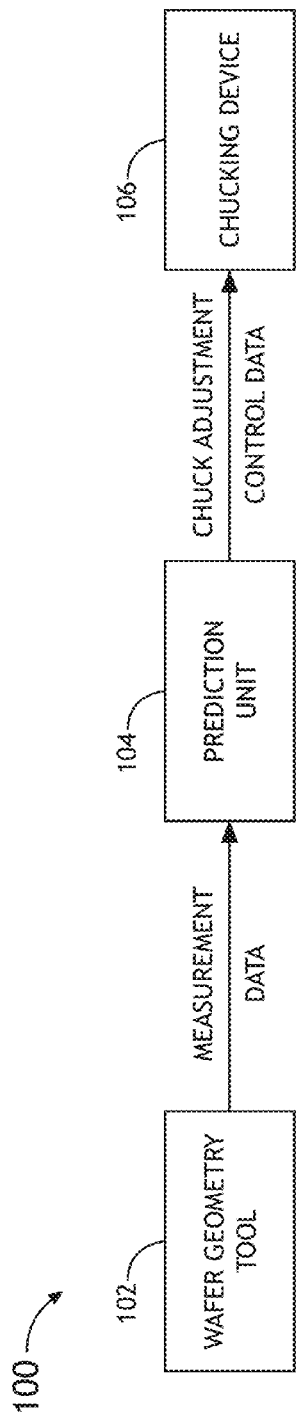
FIG. 1 is a block diagram depicting a prediction based chucking control system.
Figure 2:
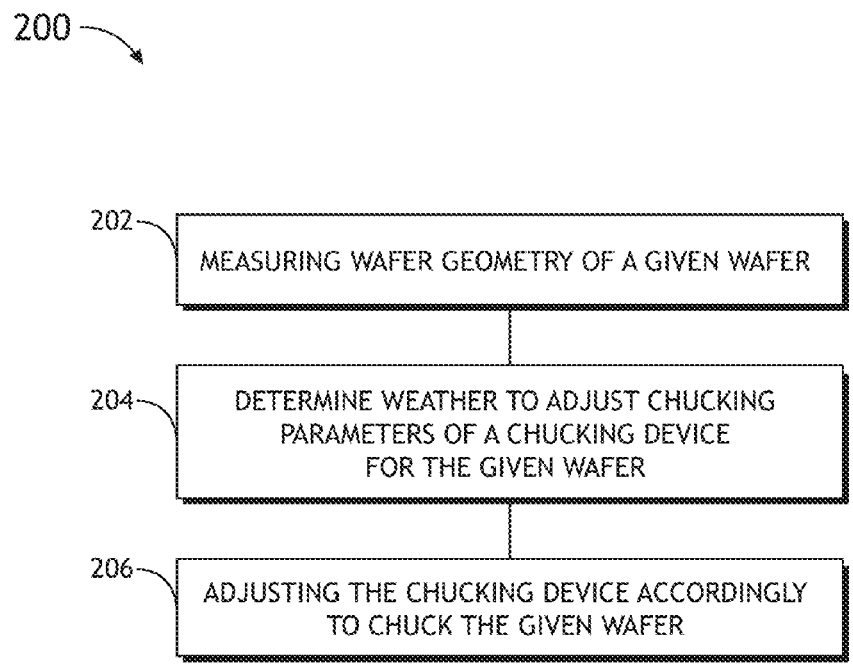
FIG. 2 is a flow diagram depicting a prediction based chucking control method.

Referring generally to FIGS. 1 and 2. FIG. 1 is a block diagram depicting an embodiment of a system 100 and FIG. 2 is a flow diagram depicting a method 200 performed utilizing the system 100. In accordance with the present disclosure, a wafer geometry tool 102 may be utilized to measure wafer geometry of a given wafer (step 202). The measurement data may be provided to a prediction unit 104, which predicts distortions that may occur as a result of chucking the given wafer to a chucking device 106. The prediction unit 104 may then determine whether adjusting chucking parameters of the chucking device 106 in any particular manner helps optimizing distortions that are predicted to occur (step 204). If adjusting chucking parameters of the chucking device 106 in a particular manner does help optimizing distortions that are predicted to occur, the chucking device 106 may be adjusted accordingly (step 206) so that distortions may be reduced when the given wafer is actually chucked.

More specifically, the wafer geometry tool 102 in accordance with embodiments of the present disclosure may include any wafer geometry system capable of measuring geometry of semiconductor wafers. It is noted that the term wafer geometry may include wafer frontside height, backside height, thickness variation, flatness, and all consequent derivatives such as shape, nanotopography and the like. In some embodiments, the WaferSight geometry system from KLA-Tencor may be utilized as the wafer geometry tool 102. It is contemplated, however, that other types of wafer geometry measurement tools may also be utilized without departing from the spirit and scope of the present disclosure.

Figure 3:
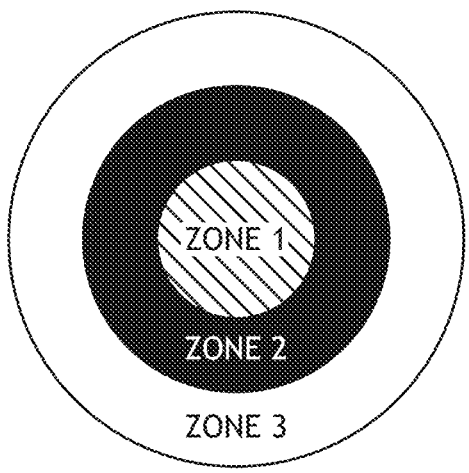
FIG. 3 is a top view illustration depicting an adjustable chuck.
Figure 4:
FIG. 4 is a side view illustration depicting the adjustable chuck of FIG. 3.

The chucking device 106 in accordance with embodiments of the present disclosure may include an adjustable chuck as illustrated in FIGS. 3 and 4. An adjustable chuck may define a plurality of zones (e.g., zones 1, 2 and 3) wherein chucking pressures can be applied. In addition, the chucking pressures can be applied following a particular chucking sequence (e.g., sequentially applied from zone 1 through zone 3). In some embodiments, the chucking pressure of each zone can be adjusted independently. Additionally and/or alternatively, the chucking sequence may be configured to be adjustable as well.

It is to be understood that the zones and sequences referenced in the example above are merely exemplary. The number and layout of the zones and sequences may vary without departing from the spirit and scope of the present disclosure. Regardless of the specific implementation of the chucking device 106, it is contemplated that the adjustable nature of the chucking device 106 can be utilized to control the deformation state of a chucked wafer. For example, releasing local chucking pressure in certain zones may allow wafer deformations to be relaxed. In addition, selectively applying chucking pressure in certain orders may also help reducing wafer deformations.

Figure 5:
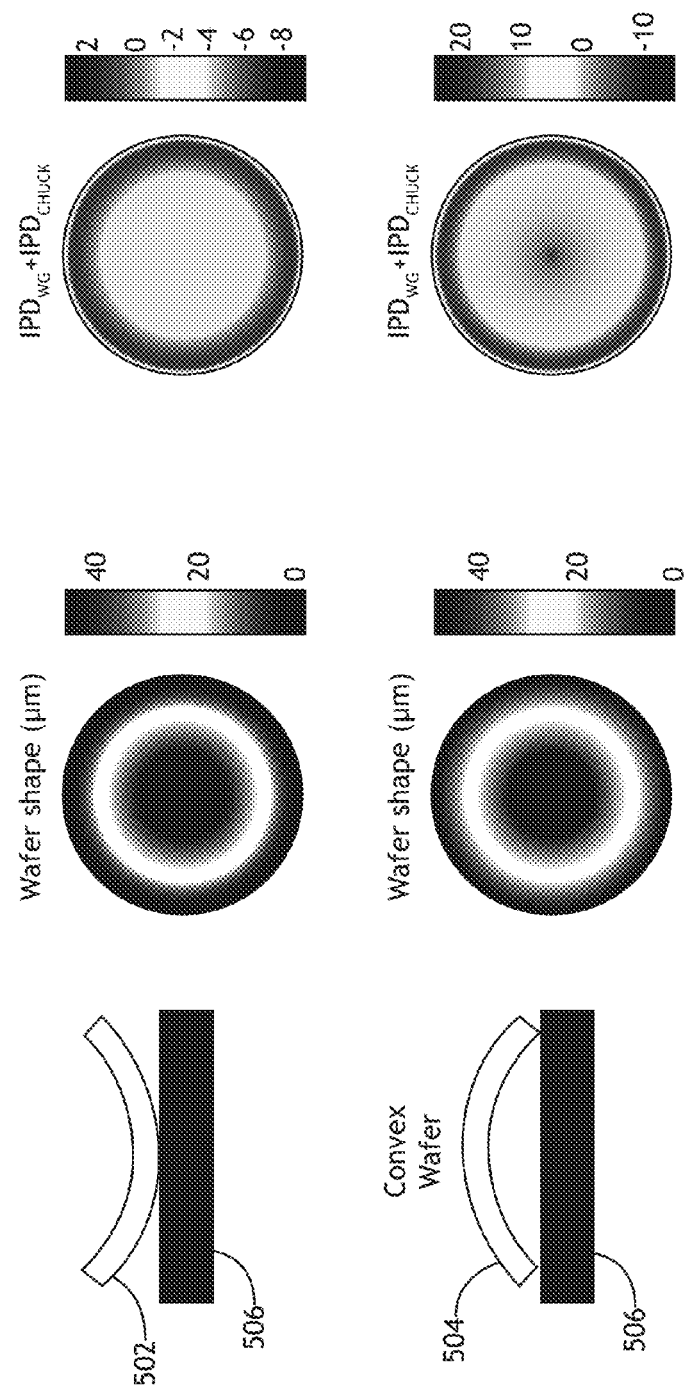
FIG. 5 is an illustration depicting different distortions observed for different shapes of wafers.
Figure 6:
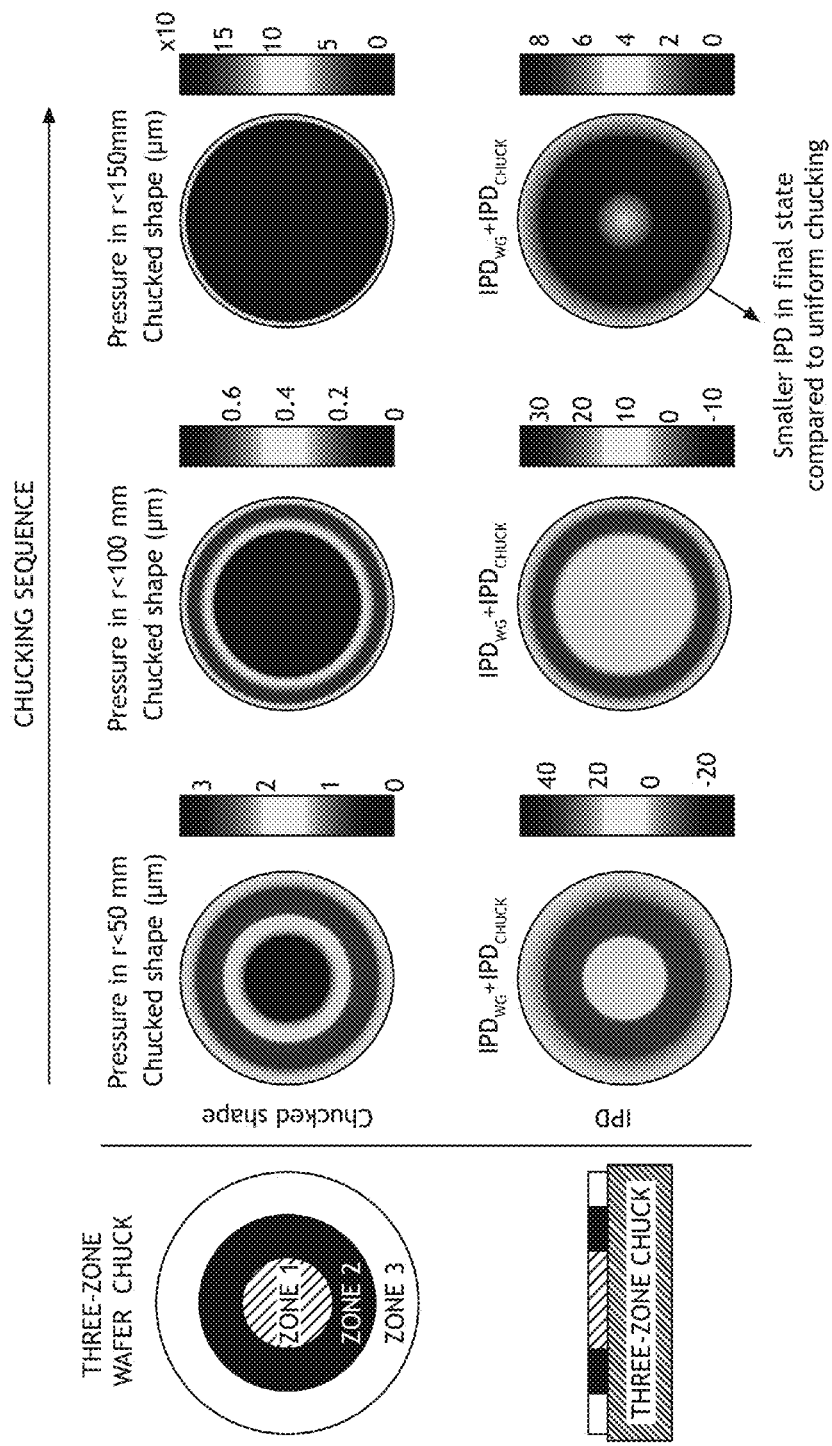
FIG. 6 is an illustration depicting an example of chucking a wafer by applying adjustable chucking pressure in a particular chucking sequence.

FIGS. 5 and 6 are illustrations depicting differences between applying uniform chucking pressure (FIG. 5) and applying adjustable chucking pressure (FIG. 6). More specifically, as depicted in FIG. 5, one wafer 502 has a concave shape and the other wafer 504 has a convex shape. If uniform chucking pressure/vacuum application is applied throughout the wafers 502 and 504, the shapes of the wafers 502 and 504 in this case would be the inverse of each other. It is noted, however, that the IPD results are quite different in both signature and magnitude, which is different from an intuitive expectation that the IPD results would simply be the inverse of each other. It is noted that the differences in IPD results are driven by interactions between each given wafer (502 or 504) and the chuck 506. Such interactions, referred to as wafer-chuck interactions, should not be ignored.

FIG. 6 is an illustration depicting an example of chucking the convex shaped wafer 504 by applying adjustable chucking pressure during the chucking process. For illustrative purposes, the chucking device is shown to have three different pressure zones where chucking pressures can be adjusted independently. In this example, by applying chucking pressure sequentially from zone 1 through zone 3, distortions are reduced for the convex shaped wafer 504.

It is to be understood that the same technique is also applicable to the concave shaped wafer 502. It is also to be understood that the convex and concave shaped wafers depicted in the example above are simplified for illustrative purposes. It is contemplated that techniques of utilizing adjustable pressure and/or adjustable sequence for chucking may be applicable to wafers of various shapes and sizes without departing from the spirit and scope of the present disclosure.

The challenge now is to determine how to adjust the chucking pressure and/or the chucking sequence (collectively referred to as chucking parameters) of the chucking device 106 so that a given wafer can be chucked in a manner that provides optimized wafer deformations. In accordance with the present disclosure, this is accomplished using the prediction unit 104. In other words, the prediction unit 104 in accordance with the present disclosure may determine the chucking parameters to be applied for a given wafer and the chucking device 106 may then apply the chucking parameters accordingly during the chucking process.

It is contemplated that the prediction unit 104 may utilize wafer geometry measurements (obtained using wafer geometry tool 102), in combination with mechanics models of the chucking process, to determine the chucking parameters to be applied for a given wafer. In some embodiments, the prediction unit 104 may utilize prediction models such as a finite element (FE) model to predict distortions that may occur as a result of chucking. For instance, the development and usage of a finite element (FE) model based distortion prediction described in: Predicting distortions and overlay errors due to wafer deformation during chucking on lithography scanners, Kevin Turner et al., Journal of Micro/Nanolithography, MEMS, and MOEMS, 8(4), 043015 (October-December 2009), and more recently, in: Relationship between localized wafer shape changes induced by residual stress and overlay errors, Kevin Turner et al., Journal of Micro/Nanolithography, MEMS, and MOEMS, 11, 013001 (2012), which are both herein incorporated by reference, may be utilized by the prediction unit 104 to perform distortion predictions. The FE model based distortion prediction utilizes full-scale three-dimensional wafer and chuck geometry information and simulates the non-linear contact mechanics of the wafer chucking mechanism, allowing the FE model to provide prediction of distortions (e.g., OPD and IPD) of the wafer surface.

It is contemplated that the FE model may also be emulated utilizing a combination of analytical and empirical methods. The development and usage of an emulated FE model is described in: System and method to emulate finite element model based prediction of in-plane distortions due to semiconductor wafer chucking, P. Vukkadala et al., U.S. patent application Ser. No. 13/735,737, which is herein incorporated by reference in its entirety.

It is noted that the FE model based prediction methods referenced above are able to simulate the mechanics of wafer distortion during processing and chucking in order to predict wafer geometry induced IPD ($IPD_{wg}$) based on wafer geometry measurements. The FE models and/or additional mechanics models can also be extended to account for chuck flatness (or more generally, chuck geometry), initial contact configuration between a given wafer and the chuck, as well as static and/or dynamic friction between the given wafer and the chuck, allowing the prediction unit 104 to effectively predict distortions induced by wafer-chuck interactions (e.g., including in-plane distortions $IPD_{chuck}$).

It is contemplated, however, that the prediction unit 104 is not required to implement the FE model based prediction methods referenced above. It is to be understood that other prediction methods such as analytical models derived from the mechanics principles, empirical models utilizing experimental data, and/or statistical/machine-learning models may also be utilized to predict the impact of wafer processing and/or chucking on in-plane distortions. It is therefore contemplated that the prediction unit 104 may implement other prediction methods in addition (or alternative) to the FE model based prediction methods without departing from the spirit and scope of the present disclosure.

It is also contemplated that the prediction unit 104 may include a processor configured to execute one or more prediction models/methods described above. The processor may be implemented as a dedicated processing unit, an application-specific integrated circuit (ASIC), an integrated component of an existing hardware, firmware or software configured to control operations of the chucking device 106, or various other types of processing units without departing from the spirit and scope of the present disclosure.

Figure 7:
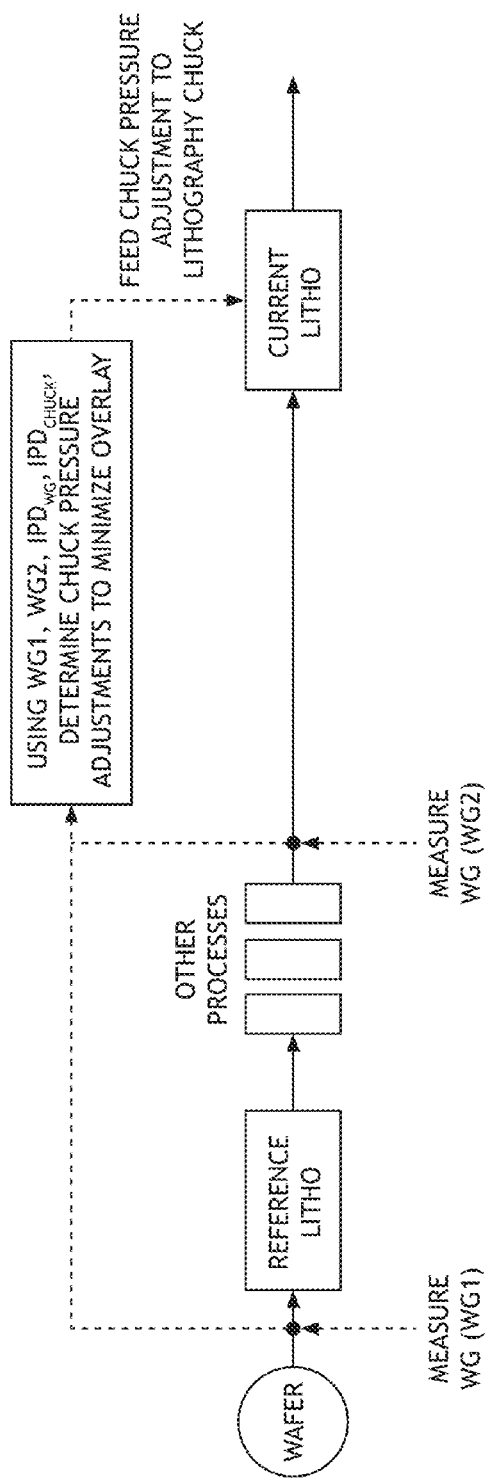
FIG. 7 is a block diagram depicting a prediction based chucking control loop for a lithography process.

It is contemplated that the prediction based chucking control techniques as described above may be utilized in various process tools during semiconductor fabrication. For example, a chucking device commonly used in a lithography tool may be controlled utilizing the prediction based chucking control techniques in accordance with the present disclosure to optimize distortions in a lithography process, which in turn helps reducing (or minimizing) overlay errors. FIG. 7 is a block diagram depicting such a prediction based chucking control loop for a lithography process.

As shown in FIG. 7, wafer geometry measurements of a wafer undergoing a lithography process may be taken prior to and after one or more process steps (e.g., a reference lithography step or other process steps) prior to the current lithography process. The wafer geometry measurements taken both prior to and after these process step(s) may then be provided to the prediction unit. As previously described, the prediction unit may utilize various prediction models to predict wafer geometry induced distortions and chucking induced distortions by taking into consideration the wafer geometry measurements in combination with other lithography parameters such as chuck flatness, static and dynamic friction between the given wafer and the chuck, as well as initial contact configuration between the wafer and the chuck. The prediction unit may then determine whether adjusting chucking parameters (e.g., chucking pressure and/or chucking sequence) of the chucking device utilized by the lithography tool may help optimizing distortions that are predicted to occur. Any adjustments deemed to be helpful by the prediction unit may then be fed to the chucking device utilized by the lithography tool. In this manner, by chucking the wafer according to the chucking parameters specified by the prediction unit, the overall distortions may be better controlled to reduce (or minimize) overlay errors that may occur.

Figure 8:
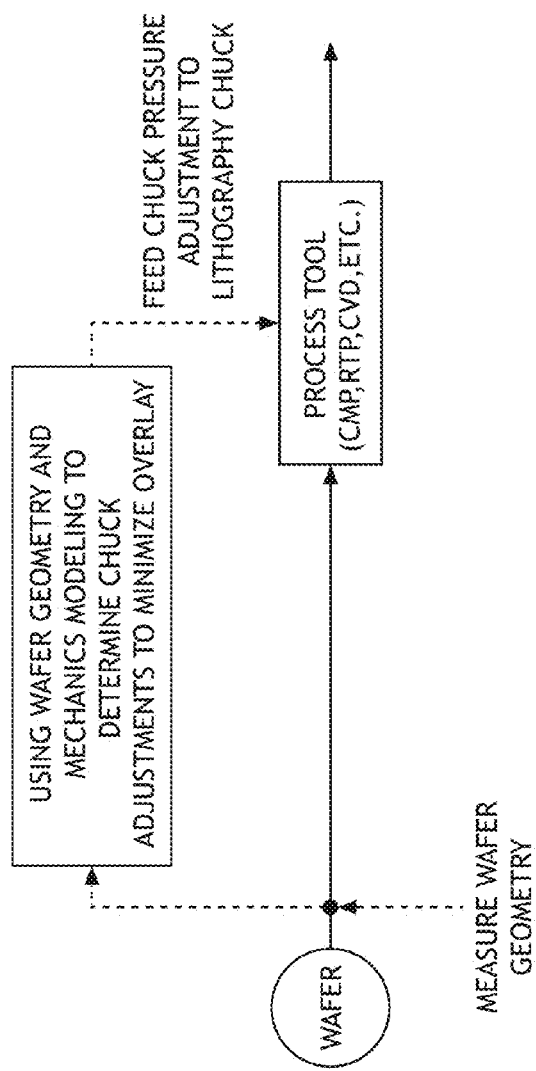
FIG. 8 is a block diagram depicting a prediction based chucking control loop for a process tool.

It is to be understood that while a lithography tool is referenced in the example above, such a reference is merely exemplary, and that the prediction based chucking control techniques in accordance with the present disclosure may be applicable to various other semiconductor process tools. Such process tools may include, but are not limited to, chemical-mechanical polishing (CMP) tools, rapid thermal processing (RTP) tools, chemical vapor deposition (CVD) tools, as well as other tools that employ wafer chucking as the wafer holding mechanism. FIG. 8 is a block diagram depicting such a process tool controlled using the prediction based chucking control techniques in accordance with the present disclosure.

Figure 9:
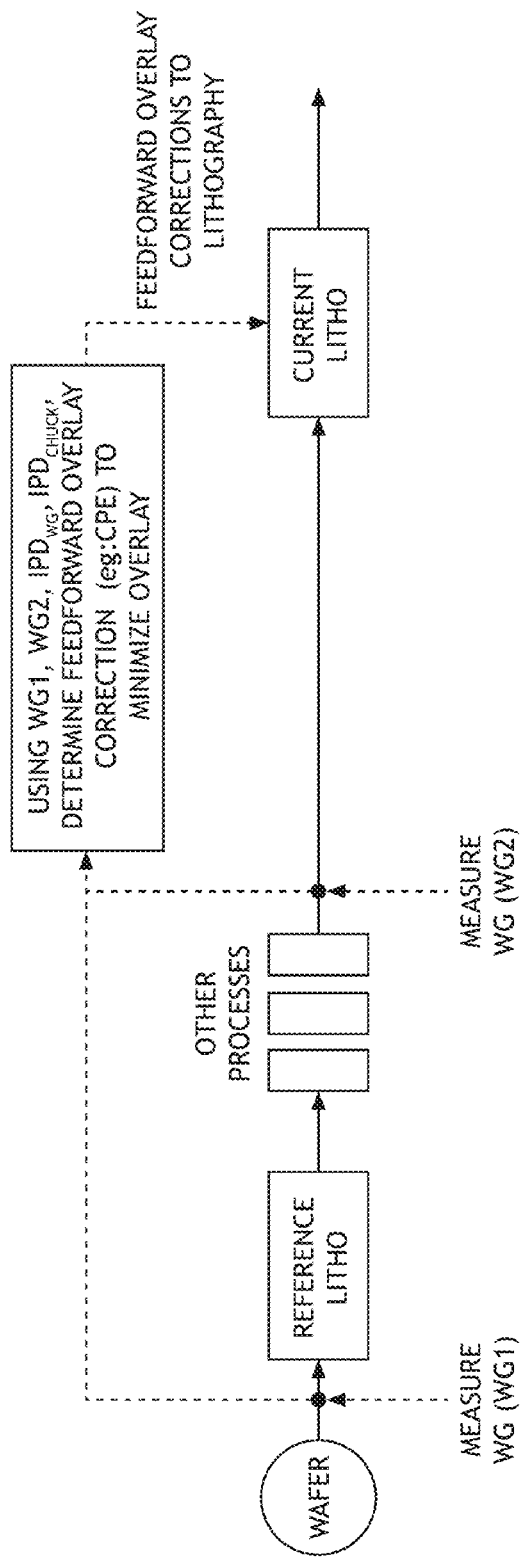
FIG. 9 is a block diagram depicting a prediction based overlay correction loop.

Furthermore, it is contemplated that overlay errors induced by wafer-chuck interactions may be reduced (or minimized) using overlay correction techniques instead of the chucking control techniques described above. FIG. 9 is a block diagram depicting an overlay correction technique. As shown in FIG. 9, wafer geometry measurements and chuck mechanics models may still be used to provide distortion predictions (same as previously described) and forward feed the prediction results to the lithography tool. However, instead of using the prediction results to control a chucking device (as previously described), the lithography tool may implement certain on-the-fly overlay correction features such as correction-per-exposure (CPE) or higher-order wafer alignment (HOWA) and the like to apply anticipatory corrections for the predicted distortions that may lead to overlay errors.

For instance, CPE is a common technique used in lithography tools, where a set of positional corrections may be stored and applied on a per exposure basis to correct particular forms of distortions. In accordance with embodiments of the present disclosure, distortion predictions may be feed-forwarded to a lithography tool that utilizes CPE, which may in turn apply anticipatory corrections for the predicted distortions to keep actual overlay errors within desired limits. It is contemplated that other on-the-fly overlay correction techniques may benefit from such feed-forward distortion predictions as well without departing from the spirit and scope of the present disclosure.

It is further contemplated that the anticipatory overlay correction techniques described in FIG. 9 may be utilized in conjunction with the chucking control techniques described in FIG. 7 in certain embodiments without departing from the spirit and scope of the present disclosure. For instance, certain distortions may cause overlay errors that are difficult to correct (or uncorrectable) using on-the-fly correction techniques. In such cases, predictions may be utilized to determine whether adjusting any chucking parameters of the chucking device may help reducing distortions that are difficult to correct (or uncorrectable); the remaining distortions may be handled using on-the-fly corrections techniques as previously described.

To reiterate, the systems and methods disclosed herein may be utilized to optimize wafer chucking processes and reduce (or minimize) distortions and residual errors, which in turn may improve efficiency of a process tool. For example, knowing that errors have been reduced or minimized utilizing the systems and methods disclosed herein, scanners used in lithography tools may reduce the number of focus and/or overlay mapping points, resulting in improved efficiency and throughput of the scanners. It is contemplated that productivity/throughput of other types of process tools may also be improved utilizing the systems and methods disclosed herein without departing from the spirit and scope of the present disclosure.

It is to be understood that the systems and methods disclosed herein may be implemented in various wafer geometry measurement tools as sets of instructions executed by one or more processors, through a single production device, and/or through multiple production devices. Further, it is to be understood that the specific order or hierarchy of steps in the methods disclosed are examples of exemplary approaches. Based upon design preferences, it is understood that the specific order or hierarchy of steps in the method can be rearranged while remaining within the scope and spirit of the disclosure. The accompanying method claims present elements of the various steps in a sample order, and are not necessarily meant to be limited to the specific order or hierarchy presented.

It is believed that the system and method of the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory.

What is claimed is:

1. A method, comprising:
   obtaining wafer geometry measurements of a wafer prior to the wafer being chucked by a chucking device;
   calculating distortions of the wafer predicted to occur when the wafer is chucked by the chucking device, wherein the predicted distortions of the wafer are calculated at least partially based on the wafer geometry measurements and a mechanics model of the chucking device;
   determining whether to adjust a chucking parameter of the chucking device at least partially based on the predicted distortions of the wafer;
   determining the chucking parameter to correct overlay error based on shape data from two or more fabrication steps and an output of the mechanics model; and
   upon determining to adjust the chucking parameter of the chucking device, providing control data to a chucking device of a fabrication tool and adjusting the chucking parameter.

2. The method of claim 1, wherein the chucking parameter includes at least one of: a chucking pressure and a chucking sequence.

3. The method of claim 1, wherein the predicted distortions include at least one of: a predicted in-plane distortion and a predicted out-plane distortion.

4. The method of claim 1, wherein the predicted distortions are calculated at least in part utilizing a finite element (FE) prediction model.

5. The method of claim 1, wherein the mechanics model is configured to simulate contact mechanics of the wafer and the chucking device based on the wafer geometry measurements and at least one of: chuck flatness data, initial contact configuration between the wafer and the chucking device, and frictions between the wafer and the chucking device.

6. The method of claim 1, wherein the chucking parameter is adjusted to reduce distortions of the wafer predicted to occur when the wafer is chucked by the chucking device.

7. The method of claim 1, wherein the chucking parameter is adjusted to reduce overlay errors.

8. The method of claim 1, wherein said obtaining wafer geometry measurements of the wafer further comprises:
   obtaining a first set of wafer geometry measurements of the wafer prior to the wafer undergoing a fabrication process; and
   obtaining a second set of wafer geometry measurements of the wafer after the fabrication process.

9. The method of claim 1, wherein the chucking device is utilized to chuck the wafer during at least one of: a lithography process, a chemical-mechanical polishing process, a rapid thermal processing process and a chemical vapor deposition process.

10. The method of claim 1, wherein the chucking device is utilized to chuck the wafer during a lithography process, and wherein the chucking parameter is utilized to reduce distortions of the wafer during the lithography process.

11. The method of claim 10, wherein the chucking parameter utilized to reduce distortions of the wafer during the lithography process includes an optimal chucking sequence.

12. The method of claim 11, wherein the optimal chucking sequence reduces overlay errors, enables a lithography scanner to reduce focus or overlay mapping points and thereby improves throughput of the lithography scanner.

13. A method, comprising:
    obtaining wafer geometry measurements of a wafer prior to the wafer being chucked by a chucking device;
    calculating distortions of the wafer predicted to occur when the wafer is chucked by the chucking device, wherein the predicted distortions of the wafer are calculated at least partially based on the wafer geometry measurements and a mechanics model of the chucking device;
    determining a chucking parameter to correct overlay error based on shape data from two or more fabrication steps and an output of the mechanics model; and
    providing control data to a chucking device of a lithography tool and adjusting the chucking parameter.

14. The method of claim 13, wherein the predicted distortions include at least one of: a predicted in-plane distortion and a predicted out-plane distortion.

15. The method of claim 13, wherein the predicted distortions are calculated at least in part utilizing a finite element (FE) prediction model.

16. The method of claim 13, wherein the mechanics model is configured to simulate contact mechanics of the wafer and the chucking device based on the wafer geometry measurements and at least one of: chuck flatness data, initial contact configuration between the wafer and the chucking device, and friction between the wafer and the chucking device.

17. The method of claim 13, wherein said obtaining wafer geometry measurements of the wafer further comprises:
    obtaining a first set of wafer geometry measurements of the wafer prior to the wafer undergoing a fabrication process; and obtaining a second set of wafer geometry measurements of the wafer after the fabrication process.

18. The method of claim 13, further comprising:
determining whether to adjust a chucking parameter of the chucking device at least partially based on the predicted distortions of the wafer, wherein the chucking parameter is utilized to reduce distortions of the wafer to reduce errors uncorrected by anticipatory corrections.

19. The method of claim 18, wherein the chucking parameter includes an optimal chucking sequence.

20. The method of claim 19, wherein the optimal chucking sequence reduces errors, enables a lithography scanner to reduce focus or overlay mapping points and thereby improves throughput of the lithography scanner.

21. A system, comprising:
a geometry measurement tool configured to obtain wafer geometry measurements of a wafer prior to the wafer being chucked by a chucking device; and
a prediction unit configured to:
calculate distortions of the wafer predicted to occur when the wafer is chucked by the chucking device, wherein the predicted distortions of the wafer are calculated at least partially based on the wafer geometry measurements and a mechanics model of the chucking device;
determine whether to adjust a chucking parameter of the chucking device at least partially based on the predicted distortions of the wafer;
determine the chucking parameter to correct overlay error based on shape data from two or more fabrication steps and an output of the mechanics model; and
upon determining to adjust the chucking parameter of the chucking device, provide control data to a chucking device of a fabrication tool and adjusting the chucking parameter.

22. The system of claim 21, wherein the chucking parameter includes at least one of: a chucking pressure and a chucking sequence.

23. The system of claim 21, wherein the predicted distortions include at least one of: a predicted in-plane distortion and a predicted out-plane distortion.

24. The system of claim 21, wherein the predicted distortions are calculated at least in part utilizing a finite element (FE) prediction model.

25. The system of claim 21, wherein the mechanics model is configured to simulate contact mechanics of the wafer and the chucking device based on the wafer geometry measurements and at least one of: chuck flatness data, initial contact configuration between the wafer and the chucking device, and frictions between the wafer and the chucking device.

26. The system of claim 21, wherein the chucking parameter is adjusted to reduce distortions of the wafer predicted to occur when the wafer is chucked by the chucking device.

27. The system of claim 21, wherein the chucking parameter is adjusted to reduce overlay errors.

28. The system of claim 21, wherein the geometry measurement tool is further configured to:
obtain a first set of wafer geometry measurements of the wafer prior to the wafer undergoing a fabrication process; and
obtain a second set of wafer geometry measurements of the wafer after the fabrication process.

29. The system of claim 21, wherein the chucking device is utilized to chuck the wafer during at least one of: a lithography process, a chemical-mechanical polishing process, a rapid thermal processing process and a chemical vapor deposition process.

30. The system of claim 21, wherein the chucking device is utilized to chuck the wafer during a lithography process, and wherein the chucking parameter is utilized to reduce distortions of the wafer during the lithography process.

31. The system of claim 30, wherein the chucking parameter utilized to reduce distortions of the wafer during the lithography process includes an improved chucking sequence.

32. The system of claim 31, wherein the improved chucking sequence reduces overlay errors, enables a lithography scanner to reduce focus or overlay mapping points and thereby improves throughput of the lithography scanner.

* * * * *